United States Patent
Hu

(10) Patent No.: US 10,121,992 B2
(45) Date of Patent: Nov. 6, 2018

(54) TRANSPARENT DISPLAYING APPARATUS

(71) Applicant: Wuhan China Star Optoelectronics Technology Co., Ltd., Wuhan (CN)

(72) Inventor: Guoren Hu, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 256 days.

(21) Appl. No.: 15/031,750

(22) PCT Filed: Feb. 26, 2016

(86) PCT No.: PCT/CN2016/074611
§ 371 (c)(1),
(2) Date: Apr. 25, 2016

(87) PCT Pub. No.: WO2017/117852
PCT Pub. Date: Jul. 13, 2017

(65) Prior Publication Data
US 2018/0047943 A1  Feb. 15, 2018

(30) Foreign Application Priority Data

Jan. 7, 2016 (CN) .......................... 2016 1 0008262

(51) Int. Cl.
*H01L 51/52* (2006.01)
*G02F 1/1347* (2006.01)
(Continued)

(52) U.S. Cl.
CPC ........ *H01L 51/5281* (2013.01); *G02F 1/1347* (2013.01); *H01L 27/32* (2013.01);
(Continued)

(58) Field of Classification Search
CPC . H01L 51/52; H01L 51/5281; H01L 51/0096; H01L 51/5206; H01L 27/3248
See application file for complete search history.

(56) References Cited

U.S. PATENT DOCUMENTS

2007/0216837 A1\* 9/2007 Ono ................... G02F 1/133753
349/117
2008/0165297 A1\* 7/2008 Matsushima ......... G02F 1/1323
349/33

(Continued)

FOREIGN PATENT DOCUMENTS

CN         105206644 A      12/2015

*Primary Examiner* — Phuc T Dang
(74) *Attorney, Agent, or Firm* — Leong C. Lei

(57) ABSTRACT

The present invention provides a transparent displaying apparatus, which includes a transparent display (30/40) and a liquid crystal twisting layer (20) arranged on a back surface of the transparent display (30/40). The liquid crystal twisting layer (20) includes therein liquid crystal molecules that selectively exhibit two states of arrangement including a first one of being substantially perpendicular to the transparent display (30/40) and a second one of being substantially parallel to the transparent display (30/40). When the liquid crystal molecules of the liquid crystal twisting layer (20) are arranged perpendicular to the transparent display (30/40), the liquid crystal twisting layer (20) is in a transparent state, such that a viewer may see, on a display screen of the transparent display (30/40), background scenery on the backside of the transparent displaying apparatus; and when the liquid crystal molecules of the liquid crystal twisting layer (20) are arranged parallel to the transparent display (30/40), the liquid crystal twisting layer (20) is in a non-transparent state, such that a viewer does not see, on the display screen of the transparent display (30/40), the background scenery on the backside of the transparent displaying apparatus and, compared to the transparent state of the liquid (Continued)

crystal twisting layer (20), the display screen of the transparent display (30/40) in this state shows relatively high displaying contrast, providing a better effect of displaying.

17 Claims, 3 Drawing Sheets

(51) Int. Cl.
*H01L 27/32* (2006.01)
*H01L 51/00* (2006.01)
*H01L 51/56* (2006.01)
*G09G 3/36* (2006.01)

(52) U.S. Cl.
CPC ...... *H01L 27/3232* (2013.01); *H01L 27/3248* (2013.01); *H01L 27/3258* (2013.01); *H01L 27/3262* (2013.01); *H01L 51/0096* (2013.01); *H01L 51/5206* (2013.01); *H01L 51/5234* (2013.01); *H01L 51/5262* (2013.01); *H01L 51/56* (2013.01); *G02F 2201/44* (2013.01); *G09G 3/36* (2013.01); *H01L 27/3206* (2013.01); *H01L 2227/323* (2013.01); *H01L 2251/303* (2013.01)

(56) References Cited

U.S. PATENT DOCUMENTS

| 2015/0091886 | A1* | 4/2015 | Quan | G02B 27/2214 345/212 |
| 2015/0124191 | A1* | 5/2015 | Yu | G02F 1/133308 349/58 |
| 2017/0155081 | A1* | 6/2017 | Zeng | H01L 51/5253 |
| 2017/0184890 | A1* | 6/2017 | Shi | G02F 1/1368 |

* cited by examiner

TRANSPARENT DISPLAYING APPARATUS

BACKGROUND OF THE INVENTION

1. Field of the Invention

The present invention relates to the field of display technology, and in particular to a transparent displaying apparatus.

2. The Related Arts

With the constant progress of the display technology, various novel displaying techniques emerge successively. Transparent display techniques are increasingly attracting the attention of people due to a transparent display panel involved and unique applications thereof.

A transparent displaying apparatus is a display that allows a viewer to view images presented on the display and also allows the viewer to see the scenery behind the display. The transparent displaying apparatus has various potential applications, such as windows of buildings and automobiles and exhibition windows of shops. In addition to the applications concerning the large-sized facility, small-sized devices, such as handheld tablet computers, may also benefit from the transparent displaying apparatus. For example, a user may review a map displayed, while at the same time observing the view in front thereof by seeing through the display screen.

It is expected that most of the contemporary display market will be progressively replaced by the transparent display in for example the fields of buildings, advertisements, and public information.

The transparent displaying apparatus may be classified as head-up display, transparent liquid crystal display (LCD), and transparent organic light-emitting diode (OLED) display. Among these displays, the head-up display achieves displaying through projection of the image. The transparent LCD and the transparent OLED are considered true transparent displays. The transparent display is disadvantageous in relatively low contrast and the contrast is much lower than that of regular displays. The reason is that the transparent display exhibits the characteristics of light transmission to some extents and thus, the background scenery on the back side of the display would interfere with the image displayed in the display. For example, when the background scenery of the back side contains patterns or images that overlap the images displayed on the transparent displaying apparatus or have colors similar to the displayed images, they may readily render negative influences, such as making the images displayed on the transparent displaying apparatus poor in sharpness and causing tiredness of human eyes.

Thus, to improve the contrast and image quality of a transparent displaying apparatus is one of the issues that need to be immediately handled by those researchers devoted in the field.

SUMMARY OF THE INVENTION

An object of the present invention is to provide a transparent displaying apparatus, which comprises a liquid crystal twisting layer arranged behind a transparent display to provide the transparent display with a transparent state and a non-transparent state, wherein in the transparent state, the display screen allows for observation of background scenery located therebehind and in the non-transparent state, the display screen provides bettered contrast and displaying effect.

To achieve the above object, the present invention provides a transparent displaying apparatus, which comprises a transparent display and a liquid crystal twisting layer arranged on a back surface of the transparent display, the liquid crystal twisting layer comprising therein liquid crystal molecules that selectively exhibit a state of arrangement of being substantially perpendicular to the transparent display and a state of arrangement of being substantially parallel to the transparent display, wherein when the liquid crystal molecules of the liquid crystal twisting layer are arranged perpendicular to the transparent display, the liquid crystal twisting layer is in a transparent state, which is adapted to allow a viewer to see, on a display screen of the transparent display, background scenery on a backside of the transparent displaying apparatus; and when the liquid crystal molecules of the liquid crystal twisting layer are arranged parallel to the transparent display, the liquid crystal twisting layer is in a non-transparent state, which prevents a viewer from seeing, on the display screen of the transparent display, the background scenery on the backside of the transparent displaying apparatus so as to allow the display screen of the transparent display to show relatively high displaying contrast as compared to the transparent state of the liquid crystal twisting layer.

The liquid crystal twisting layer covers the entirety of the back surface of the transparent display or a portion of the back surface.

The liquid crystal twisting layer comprises a first substrate and a second substrate that are opposite to each other, a liquid crystal layer interposed between the first substrate and the second substrate, a first electrode arranged on a surface of the first substrate that faces the liquid crystal layer, and a second electrode arranged on a surface of the second substrate that faces the liquid crystal layer, wherein when no voltage is applied to the first electrode and the second electrode, liquid crystal molecules of the liquid crystal layer are substantially parallel to the transparent display and the liquid crystal layer is in the non-transparent state; and when a voltage is applied to the first electrode and the second electrode, the liquid crystal molecules of the liquid crystal layer are substantially perpendicular to the transparent display and the liquid crystal layer is in the transparent state.

The first substrate and the second substrate are both transparent glass or plastic plates; and the first electrode and the second electrode are both transparent electrodes and the transparent electrodes are made of a material of transparent metal oxides.

The transparent metal oxides comprise one or more of indium tin oxides, indium zinc oxides, aluminum tin oxides, aluminum zinc oxides, and indium germanium oxides.

The transparent display comprises a transparent organic light-emitting diode (OLED) display or a transparent liquid crystal display (LCD).

The transparent OLED display comprises a thin-film transistor array substrate, a packaging structure, and an OLED arranged between the thin-film transistor array substrate and the packaging structure; and the OLED comprises an anode, a cathode and an organic function layer located between the anode and the cathode, the organic function layer comprising at least an organic emissive layer.

The organic function layer further comprises one or more of a hole injection layer, a hole transport layer, an electron blocking layer, a hole blocking layer, an electron transport layer, and an electron injection layer.

The transparent LCD comprises a liquid crystal display panel, top and bottom polarizers respectively arranged on top and bottom of the liquid crystal display panel, and a backlight module arranged under the liquid crystal display panel, the liquid crystal display panel comprising a color filter substrate and a thin-film transistor substrate that are opposite to each other and a liquid crystal layer interposed between the color filter substrate and the thin-film transistor substrate.

The backlight module is one of a side-edge backlight module and a direct backlight module, wherein the side-edge backlight module comprises a backlight source and a light guide plate arranged sideward of the backlight source; and the direct backlight module comprises a backlight source and a diffusion plate arranged above the backlight source.

The present invention also provides a transparent displaying apparatus, which comprises a transparent display and a liquid crystal twisting layer arranged on a back surface of the transparent display, the liquid crystal twisting layer comprising therein liquid crystal molecules that selectively exhibit a state of arrangement of being substantially perpendicular to the transparent display and a state of arrangement of being substantially parallel to the transparent display, wherein when the liquid crystal molecules of the liquid crystal twisting layer are arranged perpendicular to the transparent display, the liquid crystal twisting layer is in a transparent state, which is adapted to allow a viewer to see, on a display screen of the transparent display, background scenery on a backside of the transparent displaying apparatus; and when the liquid crystal molecules of the liquid crystal twisting layer are arranged parallel to the transparent display, the liquid crystal twisting layer is in a non-transparent state, which prevents a viewer from seeing, on the display screen of the transparent display, the background scenery on the backside of the transparent displaying apparatus so as to allow the display screen of the transparent display to show relatively high displaying contrast as compared to the transparent state of the liquid crystal twisting layer;

wherein the liquid crystal twisting layer covers the entirety of the back surface of the transparent display or a portion of the back surface;

wherein the liquid crystal twisting layer comprises a first substrate and a second substrate that are opposite to each other, a liquid crystal layer interposed between the first substrate and the second substrate, a first electrode arranged on a surface of the first substrate that faces the liquid crystal layer, and a second electrode arranged on a surface of the second substrate that faces the liquid crystal layer, wherein when no voltage is applied to the first electrode and the second electrode, liquid crystal molecules of the liquid crystal layer are substantially parallel to the transparent display and the liquid crystal layer is in the non-transparent state; and when a voltage is applied to the first electrode and the second electrode, the liquid crystal molecules of the liquid crystal layer are substantially perpendicular to the transparent display and the liquid crystal layer is in the transparent state; and wherein the transparent display comprises a transparent organic light-emitting diode (OLED) display or a transparent liquid crystal display (LCD).

The efficacy of the present invention is that the present invention provides a transparent displaying apparatus, which comprises a liquid crystal twisting layer arranged on a back surface of a transparent display to provide the transparent displaying apparatus with two states, a transparent state and a non-transparent state. When liquid crystal molecules contained in the liquid crystal twisting layer are arranged perpendicular to the transparent display, the liquid crystal twisting layer is in the transparent state and a viewer is allowed to see, on a display screen on the transparent display, background scenery on the backside of the transparent displaying apparatus; and when the liquid crystal molecules contained in the liquid crystal twisting layer are arranged parallel to the transparent display, the liquid crystal twisting layer is in the non-transparent state and the viewer does not see, on the display screen on the transparent display, the background scenery on the backside of the transparent displaying apparatus and in this state, the display screen of the transparent display shows relatively high contrast and provides better image quality.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
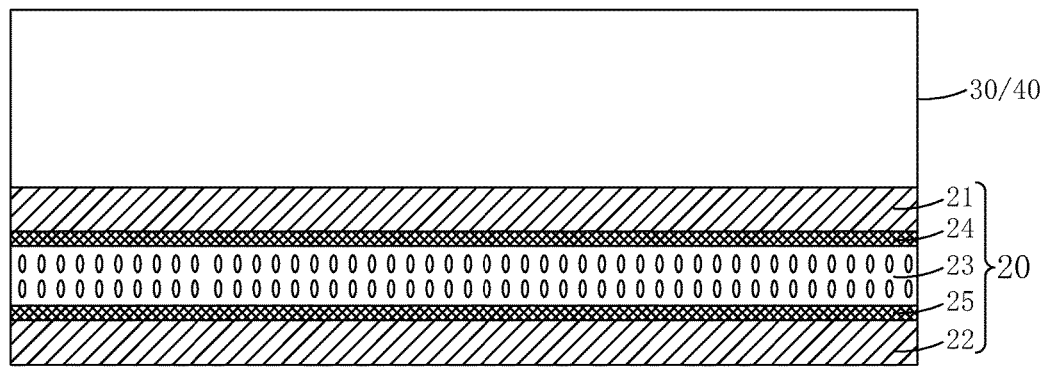
FIG. 1 is a schematic view illustrating the structure of a transparent displaying apparatus according to the present invention.
Figure 2:
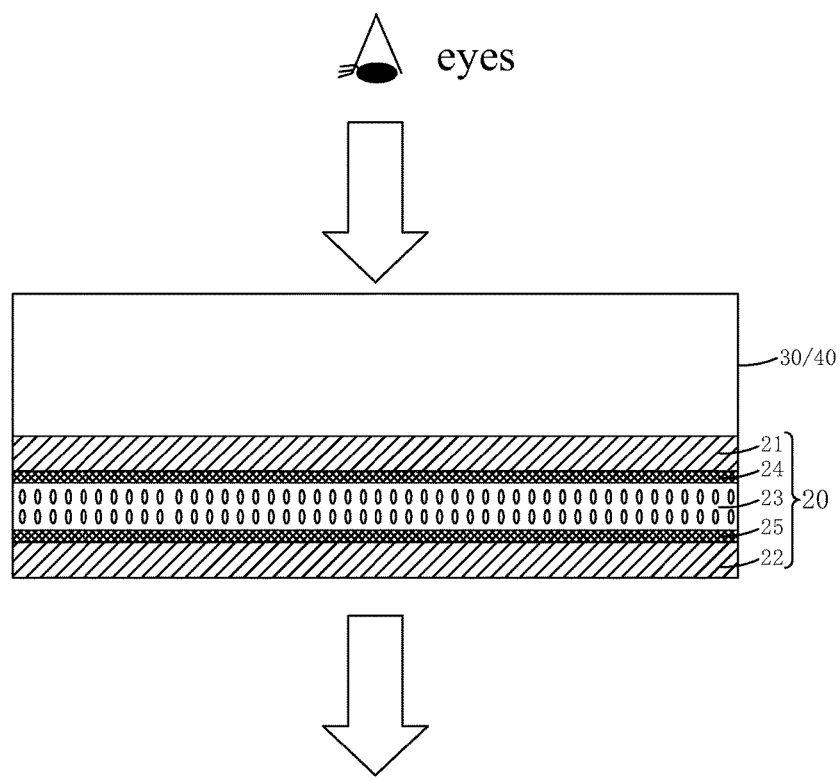
FIG. 2 is a schematic view illustrating the transparent displaying apparatus of the present invention in a transparent state.
Figure 3:
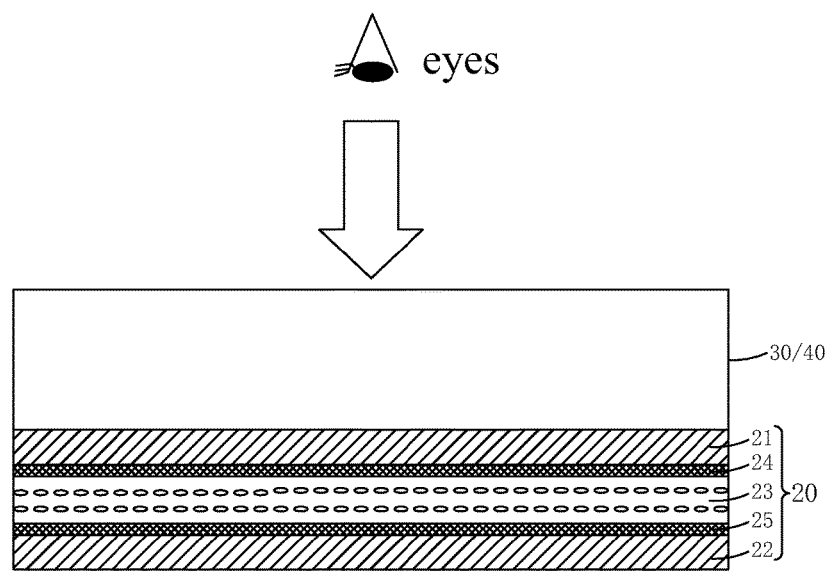
FIG. 3 is a schematic view illustrating the transparent displaying apparatus of the present invention in a non-transparent state.

Referring to FIG. 1, the present invention provides a transparent displaying apparatus, which comprises a transparent display 30/40 and a liquid crystal twisting layer 20 arranged on a back surface of the transparent display 30/40. The liquid crystal twisting layer 20 comprises therein liquid crystal molecules that selectively exhibit two states of arrangement including a first one of being substantially perpendicular to the transparent display 30/40 and a second one of being substantially parallel to the transparent display 30/40. As shown in FIG. 2, when the liquid crystal molecules of the liquid crystal twisting layer 20 are arranged perpendicular to the transparent display 30/40, the liquid crystal twisting layer 20 is in a transparent state, such that a viewer may see, on a display screen of the transparent display 30/40, background scenery on the backside of the transparent displaying apparatus; and as shown in FIG. 3, when the liquid crystal molecules of the liquid crystal twisting layer 20 are arranged parallel to the transparent display 30/40, the liquid crystal twisting layer 20 is in a non-transparent state, such that a viewer does not see, on the display screen of the transparent display 30/40, the background scenery on the backside of the transparent displaying apparatus and, compared to the transparent state of the liquid crystal twisting layer 20, the display screen of the transparent display 30/40 in this state shows relatively high displaying contrast, providing a better effect of displaying.

Specifically, the liquid crystal twisting layer 20 may cover the entire back surface of the transparent display 30/40 or just a portion of the back surface, such as covering only the part of the back surface that corresponds to a display zone.

Specifically, the liquid crystal twisting layer 20 comprises a first substrate 21 and a second substrate 22 that are opposite to each other, a liquid crystal layer 23 interposed between the first substrate 21 and the second substrate 22, a first electrode 24 arranged on a surface of the first substrate 21 that faces the liquid crystal layer 23, and a second electrode 25 arranged on a surface of the second substrate 22 that faces the liquid crystal layer 23. When no voltage is applied to the first electrode 24 and the second electrode 25, liquid crystal molecules contained in the liquid crystal layer 23 are substantially parallel to the transparent display 30/40 and the liquid crystal layer 23 is in the non-transparent state; and when a voltage is applied to the first electrode 24 and the second electrode 25, the liquid crystal molecules contained in the liquid crystal layer 23 are substantially perpendicular to the transparent display 30/40 and the liquid crystal layer 23 is in the transparent state.

Specifically, the first substrate 21 and the second substrate 22 are both transparent glass or plastic plates.

Specifically, the first electrode 24 and the second electrode 25 are both transparent electrodes. Preferably, the transparent electrodes are made of transparent metal oxides, such as one or more of indium tin oxides, indium zinc oxides, aluminum tin oxides, aluminum zinc oxides, and indium germanium oxides.

Specifically, the transparent display 30/40 can be a transparent organic light-emitting diode (OLED) display 30 or a transparent liquid crystal display (LCD) 40.

Figure 4:
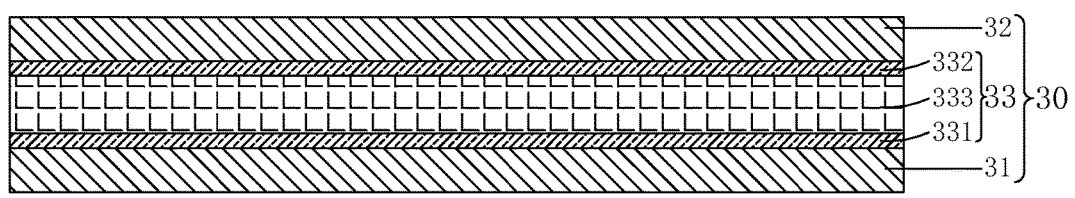
FIG. 4 is a schematic view illustrating the structure of a transparent organic light-emitting diode (OLED) display as one type of the transparent displaying apparatus according to the present invention.

Specifically, as shown in FIG. 4, the transparent OLED display 30 generally comprises a thin-film transistor array substrate 31, a packaging structure 32 (a cover plate or a packaging film), and an OLED 33 arranged between the thin-film transistor array substrate 31 and the packaging structure 32. The OLED 33 comprises an anode 331, a cathode 332, and an organic function layer 333 located between the anode 331 and the cathode 332. The organic function layer 333 comprises, at least, an organic emissive layer, and may further comprise one or more of a hole injection layer, a hole transport layer, an electron blocking layer, a hole blocking layer, an electron transport layer, and an electron injection layer.

Figure 5:
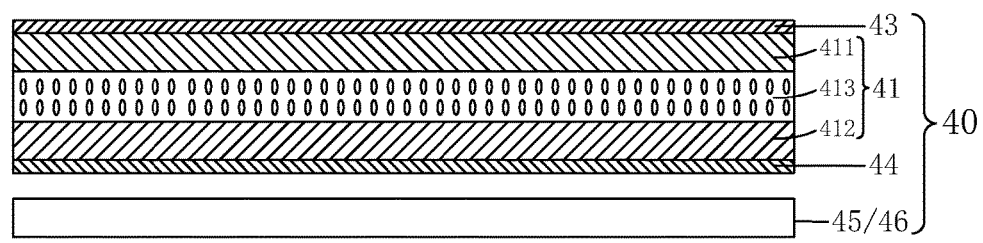
FIG. 5 is a schematic view illustrating the structure of a transparent liquid crystal display (LCD) as one type of the transparent displaying apparatus according to the present invention.

Specifically, as shown in FIG. 5, the transparent LCD 40 generally comprises a liquid crystal display panel 41, top and bottom polarizers 43, 44 respectively arranged on top and bottom of the liquid crystal display panel 41, and a backlight module 45/46 arranged under the liquid crystal display panel 41. The liquid crystal display panel 41 comprises a color filter substrate 411 and a thin-film transistor substrate 412 that are opposite to each other and a liquid crystal layer 413 interposed between the color filter substrate 411 and the thin-film transistor substrate 412.

Figure 6A:
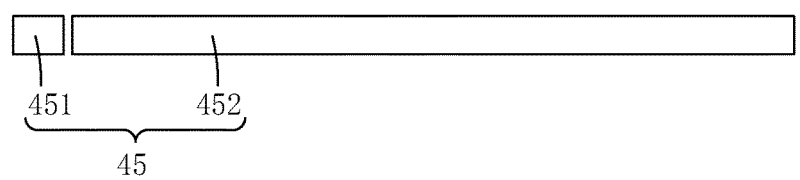
FIG. 6A is a schematic view illustrating the structure of a side-edge backlight module of the transparent liquid crystal display of FIG. 5.
Figure 6B:
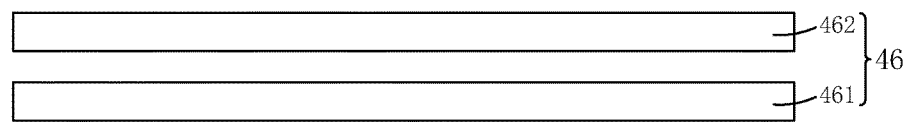
FIG. 6B is a schematic view illustrating the structure of a direct backlight module of the transparent liquid crystal display of FIG. 5.

Specifically, the backlight module 45/46 may be a side-edge backlight module 45 or a direct backlight module 46. As shown in FIG. 6A, the side-edge backlight module 45 comprises a backlight source 451 and a light guide plate 452 arranged sideward of the backlight source 451. As shown in FIG. 6B, the direct backlight module 46 comprises a backlight source 461 and a diffusion plate 462 arranged above the backlight source 461.

In summary, the present invention provides a transparent displaying apparatus, which comprises a liquid crystal twisting layer arranged on a back surface of a transparent display to provide the transparent displaying apparatus with two states, a transparent state and a non-transparent state. When liquid crystal molecules contained in the liquid crystal twisting layer are arranged perpendicular to the transparent display, the liquid crystal twisting layer is in the transparent state and a viewer is allowed to see, on a display screen on the transparent display, background scenery on the backside of the transparent displaying apparatus; and when the liquid crystal molecules contained in the liquid crystal twisting layer are arranged parallel to the transparent display, the liquid crystal twisting layer is in the non-transparent state and the viewer does not see, on the display screen on the transparent display, the background scenery on the backside of the transparent displaying apparatus and in this state, the display screen of the transparent display shows relatively high contrast and provides better image quality.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A transparent displaying apparatus, comprising a transparent display and a liquid crystal twisting layer arranged on a back surface of the transparent display, the liquid crystal twisting layer comprising therein liquid crystal molecules that selectively exhibit a first state of arrangement of being substantially perpendicular to the transparent display and a second state of arrangement of being substantially parallel to the transparent display, wherein when the liquid crystal molecules of the liquid crystal twisting layer are arranged perpendicular to the transparent display, the liquid crystal twisting layer is in a transparent state, which is adapted to allow a viewer to see, on a display screen of the transparent display, background scenery on a backside of the transparent displaying apparatus; and when the liquid crystal molecules of the liquid crystal twisting layer are arranged parallel to the transparent display, the liquid crystal twisting layer is in a non-transparent state, which prevents a viewer from seeing, on the display screen of the transparent display, the background scenery on the backside of the transparent displaying apparatus so as to allow the display screen of the transparent display to show relatively high displaying contrast as compared to the transparent state of the liquid crystal twisting layer;

wherein the transparent display has a front surface on which the display screen is arranged to display an image toward the viewer located in a front side of the transparent display that is opposite to the backside and facing the front surface of the transparent display, the back surface of the transparent display being opposite to the front surface and facing the backside and adapted to receive backside light carrying the background scenery to irradiate thereon;

wherein the liquid crystal twisting layer that is arranged on the back surface of the transparent display is switchable between the first state of arrangement and the second state of arrangement, wherein in the first state of arrangement, the liquid crystal twisting layer is of the transparent state in which the backside light irradiating on the back surface of the transparent display passes through the liquid crystal twisting layer to transmit toward and subsequently pass through the transparent display and in the second state of arrangement, the liquid twisting layer is of the non-transparent state in which the backside light irradiating on the back surface of the transparent display is blocked by the liquid crystal twisting layer from further transmitting toward and passing through the transparent display; and wherein the liquid crystal twisting layer forms a separate light blocking device that is additionally attached to the back surface of the transparent device.

2. The transparent displaying apparatus as claimed in claim 1, wherein the liquid crystal twisting layer covers the entirety of the back surface of the transparent display or a portion of the back surface.

3. The transparent displaying apparatus as claimed in claim 1, wherein the liquid crystal twisting layer comprises a first substrate and a second substrate that are opposite to each other, a liquid crystal layer interposed between the first substrate and the second substrate, a first electrode arranged on a surface of the first substrate that faces the liquid crystal layer, and a second electrode arranged on a surface of the second substrate that faces the liquid crystal layer, wherein when no voltage is applied to the first electrode and the second electrode, liquid crystal molecules of the liquid crystal layer are substantially parallel to the transparent display and the liquid crystal layer is in the non-transparent state; and when a voltage is applied to the first electrode and the second electrode, the liquid crystal molecules of the liquid crystal layer are substantially perpendicular to the transparent display and the liquid crystal layer is in the transparent state.

4. The transparent displaying apparatus as claimed in claim 3, wherein the first substrate and the second substrate are both transparent glass or plastic plates; and the first electrode and the second electrode are both transparent electrodes and the transparent electrodes are made of a material of transparent metal oxides.

5. The transparent displaying apparatus as claimed in claim 4, wherein the transparent metal oxides comprise one or more of indium tin oxides, indium zinc oxides, aluminum tin oxides, aluminum zinc oxides, and indium germanium oxides.

6. The transparent displaying apparatus as claimed in claim 1, wherein the transparent display comprises a transparent organic light-emitting diode (OLED) display or a transparent liquid crystal display (LCD).

7. The transparent displaying apparatus as claimed in claim 6, wherein the transparent OLED display comprises a thin-film transistor array substrate, a packaging structure, and an OLED arranged between the thin-film transistor array substrate and the packaging structure; and the OLED comprises an anode, a cathode and an organic function layer located between the anode and the cathode, the organic function layer comprising at least an organic emissive layer.

8. The transparent displaying apparatus as claimed in claim 7, wherein the organic function layer further comprises one or more of a hole injection layer, a hole transport layer, an electron blocking layer, a hole blocking layer, an electron transport layer, and an electron injection layer.

9. The transparent displaying apparatus as claimed in claim 6, wherein the transparent LCD comprises a liquid crystal display panel, top and bottom polarizers respectively arranged on top and bottom of the liquid crystal display panel, and a backlight module arranged under the liquid crystal display panel, the liquid crystal display panel comprising a color filter substrate and a thin-film transistor substrate that are opposite to each other and a liquid crystal layer interposed between the color filter substrate and the thin-film transistor substrate.

10. The transparent displaying apparatus as claimed in claim 9, wherein the backlight module is one of a side-edge backlight module and a direct backlight module, wherein the side-edge backlight module comprises a backlight source and a light guide plate arranged sideward of the backlight source; and the direct backlight module comprises a backlight source and a diffusion plate arranged above the backlight source.

11. A transparent displaying apparatus, comprising a transparent display and a liquid crystal twisting layer arranged on a back surface of the transparent display, the liquid crystal twisting layer comprising therein liquid crystal molecules that selectively exhibits a state of arrangement of being substantially perpendicular to the transparent display and a state of arrangement of being substantially parallel to the transparent display, wherein when the liquid crystal molecules of the liquid crystal twisting layer are arranged perpendicular to the transparent display, the liquid crystal twisting layer is in a transparent state, which is adapted to allow a viewer to see, on a display screen of the transparent display, background scenery on a backside of the transparent displaying apparatus; and when the liquid crystal molecules of the liquid crystal twisting layer are arranged parallel to the transparent display, the liquid crystal twisting layer is in a non-transparent state, which prevents a viewer from seeing, on the display screen of the transparent display, the background scenery on the backside of the transparent displaying apparatus so as to allow the display screen of the transparent display to show relatively high displaying contrast as compared to the transparent state of the liquid crystal twisting layer;

wherein the transparent display has a front surface on which the display screen is arranged to display an image toward the viewer located in a front side of the transparent display that is opposite to the backside and facing the front surface of the transparent display, the back surface of the transparent display being opposite to the front surface and facing the backside and adapted to receive backside light carrying the background scenery to irradiate thereon;

wherein the liquid crystal twisting layer that is arranged on the back surface of the transparent display is switchable between the first state of arrangement and the second state of arrangement, wherein in the first state of arrangement, the liquid crystal twisting layer is of the transparent state in which the backside light irradiating on the back surface of the transparent display passes through the liquid crystal twisting layer to transmit toward and subsequently pass through the transparent display and in the second state of arrangement, the liquid twisting layer is of the non-transparent state in which the backside light irradiating on the back surface of the transparent display is blocked by the liquid crystal twisting layer from further transmitting toward and passing through the transparent display;

wherein the liquid crystal twisting layer forms a separate light blocking device that is additionally attached to the back surface of the transparent device;

wherein the liquid crystal twisting layer covers the entirety of the back surface of the transparent display or a portion of the back surface;

wherein the liquid crystal twisting layer comprises a first substrate and a second substrate that are opposite to each other, a liquid crystal layer interposed between the first substrate and the second substrate, a first electrode arranged on a surface of the first substrate that faces the liquid crystal layer, and a second electrode arranged on a surface of the second substrate that faces the liquid crystal layer, wherein when no voltage is applied to the first electrode and the second electrode, liquid crystal molecules of the liquid crystal layer are substantially parallel to the transparent display and the liquid crystal layer is in the non-transparent state; and when a voltage is applied to the first electrode and the second electrode, the liquid crystal molecules of the liquid crystal layer are substantially perpendicular to the transparent display and the liquid crystal layer is in the transparent state; and wherein the transparent display comprises a transparent organic light-emitting diode (OLED) display or a transparent liquid crystal display (LCD).

12. The transparent displaying apparatus as claimed in claim 11, wherein the first substrate and the second substrate are both transparent glass or plastic plates; and the first electrode and the second electrode are both transparent electrodes and the transparent electrodes are made of a material of transparent metal oxides.

13. The transparent displaying apparatus as claimed in claim 12, wherein the transparent metal oxides comprise one or more of indium tin oxides, indium zinc oxides, aluminum tin oxides, aluminum zinc oxides, and indium germanium oxides.

14. The transparent displaying apparatus as claimed in claim 11, wherein the transparent OLED display comprises a thin-film transistor array substrate, a packaging structure, and an OLED arranged between the thin-film transistor array substrate and the packaging structure; and the OLED comprises an anode, a cathode and an organic function layer located between the anode and the cathode, the organic function layer comprising at least an organic emissive layer.

15. The transparent displaying apparatus as claimed in claim 14, wherein the organic function layer further comprises one or more of a hole injection layer, a hole transport layer, an electron blocking layer, a hole blocking layer, an electron transport layer, and an electron injection layer.

16. The transparent displaying apparatus as claimed in claim 11, wherein the transparent LCD comprises a liquid crystal display panel, top and bottom polarizers respectively arranged on top and bottom of the liquid crystal display panel, and a backlight module arranged under the liquid crystal display panel, the liquid crystal display panel comprising a color filter substrate and a thin-film transistor substrate that are opposite to each other and a liquid crystal layer interposed between the color filter substrate and the thin-film transistor substrate.

17. The transparent displaying apparatus as claimed in claim 16, wherein the backlight module is one of a side-edge backlight module and a direct backlight module, wherein the side-edge backlight module comprises a backlight source and a light guide plate arranged sideward of the backlight source; and the direct backlight module comprises a backlight source and a diffusion plate arranged above the backlight source.

* * * * *